(12) United States Patent
Sakumoto (10) Patent No.: US 8,624,491 B2
(45) Date of Patent: Jan. 7, 2014

(54) LIGHT EMITTING DEVICE

(75) Inventor: Daisuke Sakumoto, Higashioumi (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 13/810,591

(22) PCT Filed: Jul. 19, 2011

(86) PCT No.: PCT/JP2011/066324
§ 371 (c)(1),
(2), (4) Date: Jan. 16, 2013

(87) PCT Pub. No.: WO2012/011460
PCT Pub. Date: Jan. 26, 2012

(65) Prior Publication Data
US 2013/0114265 A1    May 9, 2013

(30) Foreign Application Priority Data

Jul. 22, 2010  (JP) ................................. 2010-164798

(51) Int. Cl.
*H05B 33/04* (2006.01)

(52) U.S. Cl.
USPC ........... 313/512; 313/501; 313/498; 257/100; 362/293

(58) Field of Classification Search
USPC ............ 313/498, 501, 512; 257/100; 362/293
See application file for complete search history.

(56) References Cited

U.S. PATENT DOCUMENTS

| | | | | |
|---|---|---|---|---|
| 7,282,853 B2 * | 10/2007 | Yano et al. | ..................... | 313/498 |
| 8,072,130 B2 * | 12/2011 | Wang et al. | ............... | 313/318.01 |
| 2002/0185965 A1 * | 12/2002 | Collins et al. | ................. | 313/501 |
| 2004/0119086 A1 | 6/2004 | Yano et al. | | |
| 2004/0124430 A1 | 7/2004 | Yano et al. | | |
| 2005/0239227 A1 | 10/2005 | Aanegola et al. | | |
| 2006/0022582 A1 | 2/2006 | Radkov | | |
| 2006/0071589 A1 | 4/2006 | Radkov | | |
| 2006/0097245 A1 | 5/2006 | Aanegola et al. | | |
| 2006/0181192 A1 | 8/2006 | Radkov et al. | | |
| 2007/0120135 A1 | 5/2007 | Soules et al. | | |
| 2007/0241657 A1 | 10/2007 | Radkov et al. | | |
| 2010/0060157 A1 * | 3/2010 | Shi | ................................ | 313/512 |

(Continued)

FOREIGN PATENT DOCUMENTS

| JP | 2004-193580 A | 7/2004 |
|---|---|---|
| JP | 2004-193581 A | 7/2004 |

(Continued)

OTHER PUBLICATIONS

International Search Report dated Aug. 23, 2011, issued for International Application No. PCT/JP2011/066324.

*Primary Examiner* — Mary Ellen Bowman
(74) *Attorney, Agent, or Firm* — Procopio, Cory, Hargreaves & Savitch LLP (57) ABSTRACT

A light emitting device includes a substrate; a light emitting element disposed on the substrate; and a wavelength conversion member disposed on or above the substrate, the wavelength conversion member covering the light emitting element spacing apart therefrom, and having a level difference at an outer peripheral portion of a lower end of the wavelength conversion member, the lower end being joined to the substrate via a light transmitting member. In addition, the light emitting device includes a light blocking member disposed on the substrate and disposed between the light emitting element and the light transmitting member. Further, the wavelength conversion member is configured so that the lower end thereof extends from a top of the light transmitting member to a side of the light transmitting member.

7 Claims, 6 Drawing Sheets

(56) References Cited

U.S. PATENT DOCUMENTS

2011/0001422 A1    1/2011   Aanegola et al.
2011/0018014 A1    1/2011   Aanegola et al.
2012/0007130 A1    1/2012   Hoelen et al.

FOREIGN PATENT DOCUMENTS

| WO | 2005/106926 A2 | 11/2005 |
| WO | 2007/111355 A1 | 10/2007 |
| WO | 2010/106504 A1 | 9/2010 |

\* cited by examiner

LIGHT EMITTING DEVICE

TECHNICAL FIELD

The present invention relates to a light emitting device including a light emitting element.

BACKGROUND ART

In recent years, development of a light emitting device having a light emitting element has progressed. The light emitting device has attracted attention with regard to power consumption or to product life. In addition, there is a light emitting device in which light emitted from a light emitting element is converted into light with a specific wavelength band by a wavelength conversion portion and is outputted to the surroundings (for example, Japanese Unexamined Patent Publication JP-A 2004-193580 and Japanese Unexamined Patent Publication JP-A 2004-193581).

In the development of a light emitting element, how light emitted from the light emitting element is converted by the wavelength conversion unit with high efficiency has been examined. An object of the invention is to provide a light emitting device capable of improving conversion efficiency of light.

DISCLOSURE OF INVENTION

A light emitting device according to an embodiment of the invention includes a substrate; a light emitting element disposed on the substrate; and a wavelength conversion member disposed on or above the substrate, the wavelength conversion member covering the light emitting element spacing apart therefrom, and having a level difference at an outer peripheral portion of a lower end of the wavelength conversion member, the lower end being joined to the substrate via a light transmitting member. In addition, the light emitting device includes a light blocking member disposed on the substrate and disposed between the light emitting element and the light transmitting member. Further, the wavelength conversion member is configured so that the lower end thereof extends from a top of the light transmitting member to a side of the light transmitting member.

DESCRIPTION OF EMBODIMENTS

Hereinafter, embodiments of a light emitting device according to the invention will be described with reference to the accompanying drawings. In addition, the invention is not limited to the following embodiment.

<Schematic Configuration of Light Emitting Device>

A light emitting device 1 according to an embodiment of the invention includes a substrate 2, a light emitting element 3 disposed on the substrate 2, and a wavelength conversion member 6 disposed on or above the substrate 2, the wavelength conversion member covering the light emitting element 3 spacing apart therefrom, and having a level difference at an outer peripheral portion of a lower end of the wavelength member, the lower end being joined to the substrate 2 via a light transmitting member 5. In addition, the light emitting device 1 includes a light blocking member 4 disposed on the substrate 2 and disposed between the light emitting element 3 and the light transmitting member 5. Further, the wavelength conversion member 6 is configured so that the lower end thereof extends from a top of the light transmitting member 5 to a side of the light transmitting member 5. Furthermore, the light emitting element 3 is, for example, a light emitting diode, emits light through recombination of electrons and holes in a pn junction using a semiconductor, and emits light outward.

The substrate 2 is an insulation substrate and is made of, for example, a ceramic material such as alumina or mullite, a glass ceramic material, or the like. In addition, the substrate 2 may use a composite material in which a plurality of materials are mixed. Further, the substrate 2 may use a polymeric resin in which metal oxide minute particles capable of adjusting the thermal expansion of the substrate 2 are dispersed.

A wiring conductor which electrically connects inside and outside of the substrate 2 is formed in the substrate 2. The wiring conductor is made of a conductive material, for example, tungsten, molybdenum, manganese, or copper. The wiring conductor may be formed by printing a metal paste obtained by adding organic solvent to a powder of tungsten or the like on a plurality of ceramic green sheets which will become the substrate 2 in a predetermined pattern and by stacking the ceramic green sheets and firing the stacked body. In addition, a plating layer such as nickel or gold is deposited on a surface of the wiring conductor exposed to the inside and an outside of the substrate 2 in order to prevent oxidation.

In addition, in order to reflect light upwards from the substrate 2 with high efficiency, a metal reflective layer such as, for example, aluminum, silver, gold, copper or platinum is formed on an upper surface of the substrate 2 spacing apart from the wiring conductor and the plating layer. Further, the metal reflective layer may be formed by coating an insulating transparent member such as a silicone resin containing white ceramic powder on portions excluding the light emitting element on the upper surface of the substrate 2.

The light emitting element 3 is mounted on the substrate 2. Specifically, the light emitting element 3 is electrically connected via, for example, a brazing material or solder, on the plating layer deposited on the surface of the wiring conductor formed on the substrate 2.

The light emitting element 3 has a light transmitting base and an optical semiconductor layer formed on the light transmitting base. The light transmitting base may use a base where an optical semiconductor layer is grown using a chemical vapor deposition such as a metal organic chemical vapor deposition or a molecular beam epitaxial deposition. As a material of the light transmitting base, for example, sapphire, gallium nitride, aluminum nitride, zinc oxide, zinc selenide, silicon carbide, silicon, or zirconium diboride may be used. In addition, the thickness of the light transmitting base is, for example, 50 μm or more and 1000 μm or less.

The optical semiconductor layer is constituted by a first semiconductor layer formed on the light transmitting base, a light emitting layer formed on the first semiconductor layer, and a second semiconductor layer formed on the light emitting layer.

The first semiconductor layer, the light emitting layer, and the second semiconductor layer may use, for example, a group III nitride-based semiconductor, a group III-V semiconductor such as gallium phosphorous or gallium arsenide, a group III nitride-based semiconductor such as gallium nitride, aluminum nitride or indium nitride, or the like. In addition, the thickness of the first semiconductor layer is, for example, 1 μm or more and 5 μm or less, the thickness of the light emitting layer is, for example, 25 nm or more and 150 nm or less, and the thickness of the second semiconductor layer is, for example, 50 nm or more and 600 nm or less. Further, the light emitting element 3 may use an element which emits excitation light in a wavelength range of, for example, 370 nm or more and 420 nm or less.

The light blocking member 4 is disposed on the substrate 2 spacing apart from the light emitting element 3. The light blocking member 4 has at least one of a function of reflecting excitation light emitted by the light emitting element 3 and a function of absorbing excitation light emitted by the light emitting element 3. The light blocking member 4 is made of, for example, a ceramic material such as alumina or mullite, a white epoxy material, a resin material such as polytetrafluoroethylene, a composite material where white alumina powder is contained in a transparent epoxy resin or silicone resin, or a metal material such as aluminum or a copper or iron-nickel alloy on which silver plating or gold plating is performed. The light blocking member 4 is disposed on the substrate 2 via an adhesive such as, for example, a silicone resin, an acryl resin, or an epoxy resin. In addition, the thermal conductivity of the light blocking member 4 is, for example, 0.1 W/(m·K) or more and 418 W/(m·K) or less.

The light blocking member 4 is disposed surrounding the light emitting element 3. The light blocking member 4 has a ring shape in a plan view. In addition, the outer diameter of the light blocking member 4 is, for example, 5 mm or more and 20 mm or less, and the inner diameter of the light blocking member 4 is, for example, 4 mm or more and 19 mm or less. Further, the size of the light blocking member 4 in a vertical direction is, for example, 0.1 mm or more and 1 mm or less. Since the light blocking member 4 surrounds the light emitting element 3, light emitted from the light emitting element 3 in a plane direction can be reflected by the light blocking member 4 or absorbed by the light blocking member 4.

The light blocking member 4 is formed in a ring shape centering on the light emitting element 3. For this reason, light which travels radially from the light emitting element 3 in the plane direction can be reflected inward with little bias or absorbed by the light blocking member 4, and thus light outputted toward the outside from the light emitting device 1 can be suppressed from being concentrated on a biased portion, thereby realizing the light emitting device 1 having excellent visibility.

The light blocking member 4 is provided with a recess P at the side of the light blocking member 4 facing the side of the light emitting element 3. In the recess P, the size between the upper surface of the substrate 2 and a ceiling plane which is a part of an inner wall surface of the recess P is set to, for example, 0.05 mm or more and 0.9 mm or less. In addition, the size of the recess P in the plane direction is set to, for example, 0.5 mm or more and 10 mm or less.

In the light blocking member 4, the size of the recess P in the plane direction along the upper surface of the substrate 2 is set to be larger than the size of the recess P in the vertical direction relative to the upper surface of the substrate 2. In a case where the size of the recess P in the plane direction is smaller than the size of the recess P in the vertical direction, there is a concern that light traveling in the plane direction from the light emitting element 3 is reflected toward the inside by the light blocking member 4 more than necessary, and thus a range of a traveling angle of light traveling toward the outside from the light emitting device 1 is narrowed more than necessary. Therefore, the size of the recess P in the plane direction is made larger than the size of the recess P in the vertical direction, and thereby it is possible to suppress a range of a traveling angle of light traveling toward the outside from the light emitting device 1 from being narrowed more than necessary.

The light blocking member 4 is provided with the recess P, and thereby it is possible to reduce the volume of the light blocking member 4 as compared with a case where the light blocking member 4 is not provided with the recess P. The light emitting element 3 emits light and simultaneously generates heat, but the heat is conducted to the light blocking member 4 from the light emitting element 3 via the substrate 2. In addition, the heat generated from the light emitting element 3 is also conducted to the light blocking member 4 via the air surrounded by the wavelength conversion member 6. Therefore, by reducing the volume of the light blocking member 4, it is possible to decrease the heat conducted to the wavelength conversion member 6. Further, in a case where the recess P is provided in an inside of the light blocking member 4 facing the light emitting element 3, the distance between the inner wall surface of the recess P and the light emitting element 3 can be lengthened, and thus it is possible to reduce the heat conducted to the light blocking member 4. As a result, it is possible to reduce heat conducted to the wavelength conversion member 6, and thereby it is possible to suppress reduction of conversion efficiency of light of the wavelength conversion member 6 due to the heat, which reduction of conversion efficiency is caused by subjecting fluorescent substances to high temperature. In addition, it is possible to alleviate the thermal stress due to a material difference between the wavelength conversion member 6 and the light blocking member 4. Further, it is possible to suppress separation of the wavelength conversion member 6 from the light blocking member 4.

Furthermore, the light blocking member 4 is provided with the recess P, and thereby the light blocking member 4 is deformed when the thermal stress is applied from the wavelength conversion member 6. The deformation of the light blocking member 4 leads to, for example, deformation of a tilt angle of the ceiling plane of the recess P of the light blocking member 4, and thereby it is possible to alleviate the stress in the recess P. As a result, it is possible to reduce such concern that the light blocking member 4 may be damaged, and thus it is possible to improve the air tightness of the light emitting device 1 and further to lengthen the product life of the light emitting device 1.

The wavelength conversion member 6 covers the light emitting element 3 spacing apart therefrom and is joined to the light blocking member 4 via the light transmitting member 5. The wavelength conversion member 6 allows light emitted from the light emitting element 3 to enter its inside, and emits light by fluorescent substances contained therein being excited.

The wavelength conversion member 6 has a circular shape in a plan view, and is a cap body having an internal space. In addition, the outer diameter of the wavelength conversion member 6 is, for example, 5 mm or more and 20 mm or less, and the inner diameter of the internal space of the wavelength conversion member 6 is set to, for example, 4 mm or more and 19 mm or less. Further, the length from the lower end to the upper end of the wavelength conversion member 6 is set to, for example, 2.5 mm or more and 10 mm or less. Furthermore, the length of the internal space of the wavelength conversion member 6 in the vertical direction is set to, for example, 2 mm or more and 9.5 mm or less. Since the wavelength conversion member 6 has a circular shape in a plan view and the light emitting element 3 is disposed at the central position of an inside thereof, the thickness of the edge of the wavelength conversion member 6 in a plan view can be made substantially constant, and thereby a conversion amount of light outputted to the surroundings can be made substantially uniform. Further, here, the fact that thickness of the edge of the wavelength conversion member 6 is substantially constant indicates a state where a difference in the thickness of the edge of the wavelength conversion member 6 in cross-sectional view is set to, for example, 1 mm or less.

Light emitted by the light emitting element 3 travels through the internal space surrounded by the wavelength conversion member 6 and enters the wavelength conversion member 6. In the light emitted by the light emitting element 3, the light before entering the wavelength conversion member 6 travels through the internal space. Therefore, the light is thus hardly influenced by reflection, refraction, attenuation, or the like, and enters the wavelength conversion member 6 with high efficiency.

The wavelength conversion member 6 is made of, for example, a light transmitting insulating resin such as a silicone resin, an acryl resin, or an epoxy resin, or a light transmitting glass material. In the insulating resin or the glass, blue fluorescent substances generating fluorescence of, for example, 430 nm or more and 490 nm or less, green fluorescent substances generating fluorescence of, for example, 500 nm or more and 560 nm or less, yellow fluorescent substances generating fluorescence of, for example, 540 nm or more and 600 nm or less, and red fluorescent substances generating fluorescence of, for example, 590 nm or more and 700 nm or less are contained. In addition, the fluorescent substances are uniformly dispersed in the wavelength conversion member 6. Further, thermal conductivity of the wavelength conversion member 6 is set to, for example, 0.1 W/(m·K) or more and 0.8 W/(m·K) or less.

Figure 3:
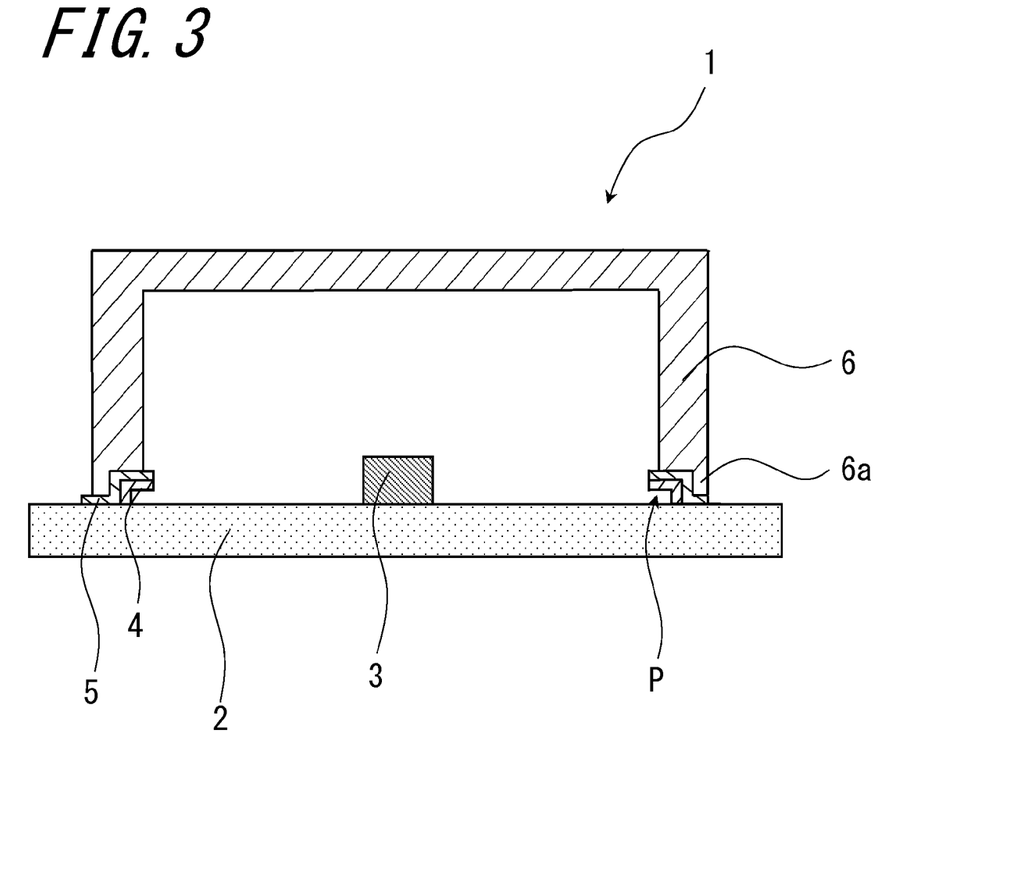
FIG. 3 is a cross-sectional view of a light emitting device according to an embodiment of the invention.

Further, the wavelength conversion member 6 has a level difference on an outer peripheral side of the lower end as shown in FIG. 3. In addition, in the wavelength conversion member 6, the location at which the level difference is disposed functions as an extending portion 6a which extends from the top of the light transmitting member 5 to the side of the light transmitting member 5. The extending portion 6a is a part of the wavelength conversion member 6. The extending portion 6a is joined to the light blocking member 4 via the light transmitting member 5. For the light transmitting member 5, a light transmitting insulating resin such as, for example, a silicone resin, an acryl resin, or an epoxy resin is used. Furthermore, the thermal conductivity of the light transmitting member 5 is set to, for example, 0.1 W/(m·K) or more and 0.8 W/(m·K) or less.

The light transmitting member 5 is adhered on the entire lower surface of the wavelength conversion member 6, thus the area adhered on the light blocking member 4 via the light transmitting member 5 is increased, and thereby it is possible to rigidly connect the light blocking member 4 to the wavelength conversion member 6. As a result, it is possible to improve the connection strength between the light blocking member 4 and the wavelength conversion member 6 and to thereby suppress separation of the wavelength conversion member 6.

In addition, when there is no level difference at the lower end of the wavelength conversion member 6, the lower end of the wavelength conversion member 6 is connected only to the upper surface of the light blocking member 4. In the light emitting device 1 according to the present embodiment, since the extending portion 6a has a shape extending from the upper surface of the light blocking member 4 to the side surface of the light blocking member 4, and the light transmitting member 5 is interposed between the extending portion 6a and the light blocking member 4, it is possible to increase the connection area between the extending portion 6a and the light blocking member 4 and to thereby connect the wavelength conversion member 6 to the light blocking member 4 effectively rigidly.

The thermal conductivity of the light transmitting member 5 is set to be smaller than the thermal conductivity of the wavelength conversion member 6. The thermal conductivity of the light transmitting member 5 is set to be smaller than the thermal conductivity of the wavelength conversion member 6, and thereby it is possible to make conduction of heat from the light emitting element 3 to the wavelength conversion member 6 via sequentially the substrate 2, the light blocking member 4, and the light transmitting member 5 difficult. In addition, in the wavelength conversion member 6, heat is generated due to conversion losses when the fluorescent substances perform wavelength conversion for light emitted by the light emitting element 3, and the temperature of the light emitting element 3 increases due to the heat. Conduction of heat from the wavelength conversion member 6 via the light transmitting member 5 is made difficult, and thereby it is possible to suppress temperature elevation of the light emitting element 3. Further, variations in light due to the high temperature of the light emitting element 3 can be suppressed, and thus it is possible to favorably maintain a light color outputted to the surroundings from the light emitting device 1.

When the wavelength conversion member 6 is subjected to high temperature, a color temperature of light excited by excitation light emitted by the light emitting element 3 varies, and thus it is difficult to obtain a light color of a desired color temperature. Therefore, the thermal conductivity of the light transmitting member 5 is smaller than the thermal conductivity of the wavelength conversion member 6, and the thermal resistance is increased, so as to suppress conduction of heat from the light emitting element 3 through the substrate 2 and via the light transmitting member 5 to the wavelength conversion member 6. Therefore, it is possible to suppress temperature elevation of the wavelength conversion member 6 and to thereby output a desired light color.

The light transmitting member 5 is formed so as to continuously extend from the top of the light transmitting member 5 to an outside of the light transmitting member 5 and is further formed so as to continuously extend from an outside of the light blocking member 4 to the upper surface of the substrate 2. In addition, the lower end of the wavelength conversion member 6 is connected to the top of the light transmitting member 5. The extending portion 6a of the wavelength conversion member 6 is disposed such that the extending portion 6a and the light blocking member 4 overlap each other when the light emitting device 1 is viewed through from the side surface.

Since the light transmitting member 5 is formed so as to continuously extend from the top of the light transmitting member 5 to the top of the substrate 2 via the outside of the light transmitting member 5, it is possible to use the light transmitting member 5 itself as a transmission path of temperature. In addition, although the temperature inside the region surrounded by the wavelength conversion member 6 is raised by heat generated by the light emitting element 3, the temperature inside the region surrounded by the wavelength conversion member 6 can be directly radiated to the outside effectively, and thus it is possible to suppress the temperature elevation inside the region surrounded by the wavelength conversion member 6. As a result, variations in a light color outputted to the surroundings can be made difficult, and thereby it is possible to realize the light emitting device 1 which can favorably maintain the visibility.

A large number of light beams traveling in the plane direction from the light emitting element 3 are reflected by the light blocking member 4 and then travel toward the wavelength conversion member 6. In addition, of the light beams traveling in the plane direction from the light emitting element 3, there are light beams traveling inside the light transmitting member 5; however, the light beams traveling inside the light transmitting member 5 enter the extending portion 6a since the extending portion 6a is disposed so as to overlap the light blocking member 4 when viewed through from the side surface. Further, light having undergone wavelength conversion in the extending portion 6a is outputted to the surroundings of the light emitting device 1.

In a case where the wavelength conversion member 6 and the light blocking member 4 do not overlap each other when the light emitting device 1 is viewed through from the side surface, light beams traveling inside the light transmitting member 5 of light beams traveling in the plane direction from the light emitting element 3 do not enter the wavelength conversion member 6 but are outputted to the surroundings and thus do not undergo wavelength conversion in the wavelength conversion member 6. On the other hand, in the light emitting device 1 according to the present embodiment, the extending portion 6a extends from the top of the light blocking member 4 to the side end portion of the light blocking member 4, and thus light beams traveling in the plane direction from the light emitting element 3 enter the wavelength conversion member 6. As a result, the light emitting device 1 according to the present embodiment can improve conversion efficiency of light.

In a case where the extending portion 6a is disposed on the inside of the light blocking member 4, when the wavelength conversion member 6 causes thermal expansion, the wavelength conversion member 6 tends to expand outwardly, and thus great stress is apt to be applied to the light blocking member 4. Further, the light blocking member 4 may be separated from the substrate 2 due to the stress. On the other hand, even if heat is conducted to the wavelength conversion member 6 thus the wavelength conversion member 6 causes thermal expansion, the extending portion 6a is disposed on the outside of the light blocking member 4. Accordingly, even if the wavelength conversion member 6 expands outwardly, it is possible to reduce stress applied to the light blocking member 4 and to thereby suppress separation of the light blocking member 4.

According to the present embodiment, since the light blocking member 4 is disposed around the light emitting element 3, and the extending portion 6a of the wavelength conversion member 6 extends from the top of the light transmitting member 5 to the side end portion of the light transmitting member 5, it is possible to reduce output of light emitted in the plane direction of the light emitting element 3 to the outside after passing through the light transmitting member 5 as it is, so as to be reflected by the light blocking member 4 or to undergo wavelength conversion in the wavelength conversion member 6. In addition, the light reflected by the light blocking member 4 can easily travel inside the wavelength conversion member 6 by changing a traveling direction of the light. As a result, a large amount of light emitted by the light emitting element 3 can enter the wavelength conversion member 6, and thereby it is possible to effectively improve conversion efficiency of light. According to the present embodiment, it is possible to provide the light emitting device 1 capable of improving wavelength conversion efficiency of light.

In addition, the invention is not limited to the above-described embodiment, and various modifications, alterations, and the like in the scope without departing from the scope of the invention. For example, according to the above-described embodiment, although the shape of the wavelength conversion member 6 is a circular shape in a plan view, the shape thereof is not limited thereto. As long as light emitted by the light emitting element 3 can be scattered, a polygonal shape in a plan view may be employed, or a three-dimensional shape may be a dome shape. In addition, a three-dimensional shape of the wavelength conversion member 6 is a dome shape, and therefore it is possible to make the thickness of the wavelength conversion member 6 through which light emitted by the light emitting element 3 passes substantially constant and to thereby make a conversion amount of light outputted to the surroundings substantially uniform.

In addition, the surface of the light blocking member 4 may be a diffusion reflective surface. As a result, light from the light emitting element 3 entering the light transmitting member 5 is diffused and reflected on the surface of the light blocking member 4 and undergoes wavelength conversion in the wavelength conversion member 6. Therefore, a light output of the light emitting device 1 is improved, and radiation of light from the light emitting element 3 to an outside of the light emitting device 1 is suppressed.

In addition, the side end portion of the light transmitting member 5 may be formed to be thicker than the top of the light blocking member 4. As a result, light from the light emitting element 3 is hard to enter the light transmitting member 5 of the top of the light blocking member 4, and light from the light emitting element 3 which has entered up to the light transmitting member 5 of the side end portion of the light blocking member 4 is reflected inside the light transmitting member 5 of the side end portion of the light blocking member 4 and undergoes wavelength conversion in the wavelength conversion member 6. As a result, a light output of the light emitting device 1 is improved, and radiation of light of the light emitting element 3 to the outside of the light emitting device 1 is suppressed.

MODIFIED EXAMPLES

Figure 2:
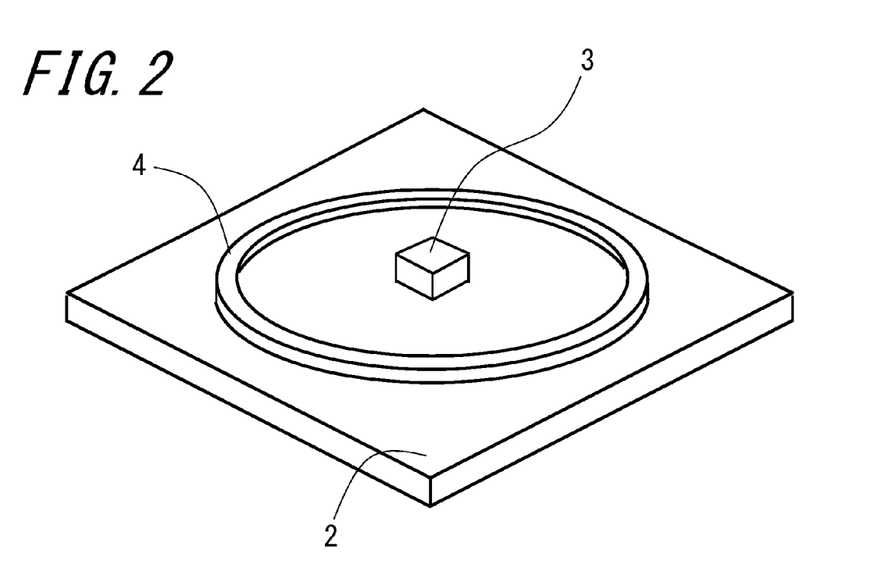
FIG. 2 is a schematic perspective view of the light emitting device according to the embodiment of the invention, and shows a state where a wavelength conversion member is removed.

Hereinafter, modified examples of the embodiment of the invention will be described. In light emitting devices 1 according to the modified examples of the embodiment of the invention, the same portions as in the light emitting device 1 according to the embodiment of the invention are denoted by the same reference numerals and description thereof will be appropriately omitted. In addition, FIGS. 4 to 7 are cross-sectional views of the light emitting devices 1 according to modified examples, respectively, and correspond to the cross-sectional view of FIG. 2.

Figure 4:
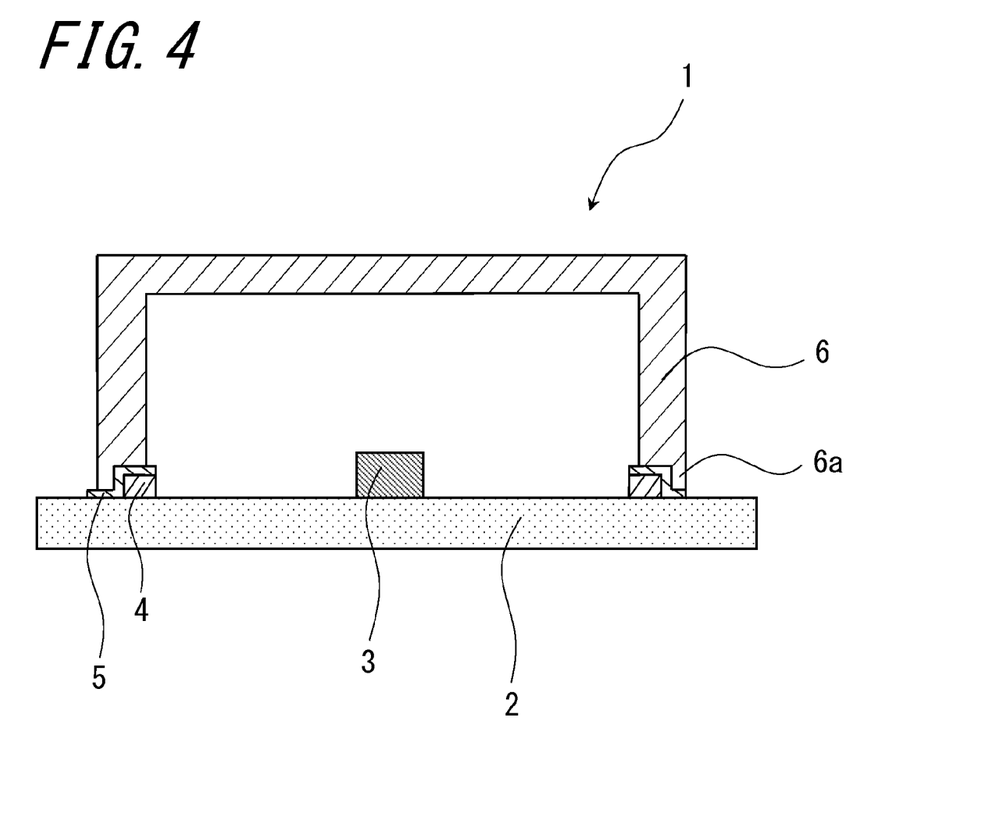
FIG. 4 is a cross-sectional view of a light emitting device according to a modified example.

Although the light emitting device 1 according to the above-described embodiment has a structure in which the light blocking member 4 is provided with the recess P, the invention is not limited thereto. As shown in FIG. 4, a structure may be used in which the light blocking member 4 is not provided with the recess P.

As shown in FIG. 4, in a case where the light blocking member 4 is not provided with a recess P, the connection area where the lower surface of the light blocking member 4 is connected to the upper surface of the substrate 2 can be increased, and thereby it is possible to improve bondability between the light blocking member 4 and the substrate 2. As a result, it is possible to suppress separation of the light blocking member 4 from the substrate 2.

Although, in the light emitting device 1 according to the above-described embodiment, the light transmitting member 5 is adhered only on the lower surface of the lower end of the wavelength conversion member 6, the invention is not limited thereto. The light transmitting member 5 may be formed so as to continuously extend from the lower end of the wavelength conversion member 6 to the side surface of the wavelength conversion member 6.

Figure 5:
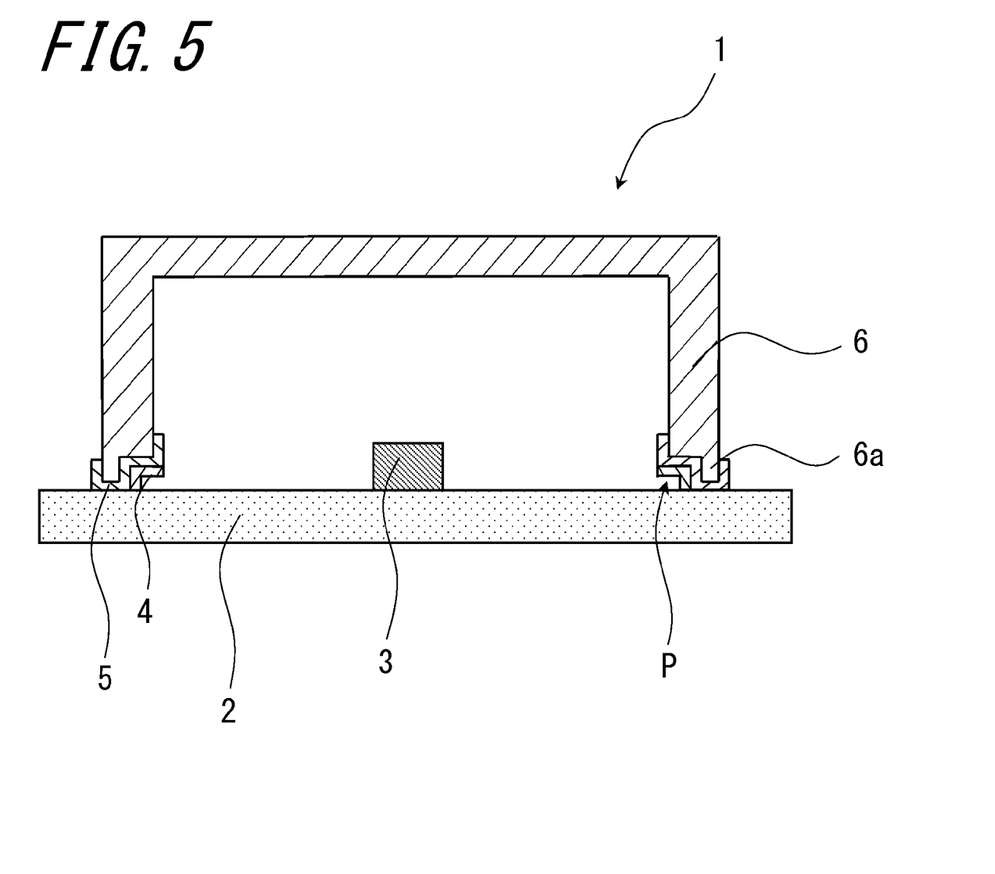
FIG. 5 is a cross-sectional view of a light emitting device according to a modified example.

As shown in FIG. 5, the light transmitting member 5 is continuously adhered on the lower end of the wavelength conversion member 6 from the lower surface of the lower end of the wavelength conversion member 6 to the side surface of the lower end of the wavelength conversion member 6, and thereby it is possible to surround the lower end of the wavelength conversion member 6 by the light transmitting member 5. In addition, the outer surface of the extending portion 6a is covered by the light transmitting member 5, and, thereby, when the extending portion 6a causes thermal expansion, the expansion in the plane direction can be suppressed by the light transmitting member 5. Further, since the extending portion 6a of the wavelength conversion member 6 is provided so as to extend from the upper surface of the light blocking member 4 to the outside of the light blocking member 4, when the extending portion 6a causes thermal expansion, a force is applied in a direction distant from the light blocking member 4 and thus the extending portion tends to be separated from the light blocking member 4. Therefore, the extending portion 6a is covered by the light transmitting member 5, and thereby it is possible to suppress separation of the extending portion 6a from the light blocking member 4.

Figure 6:
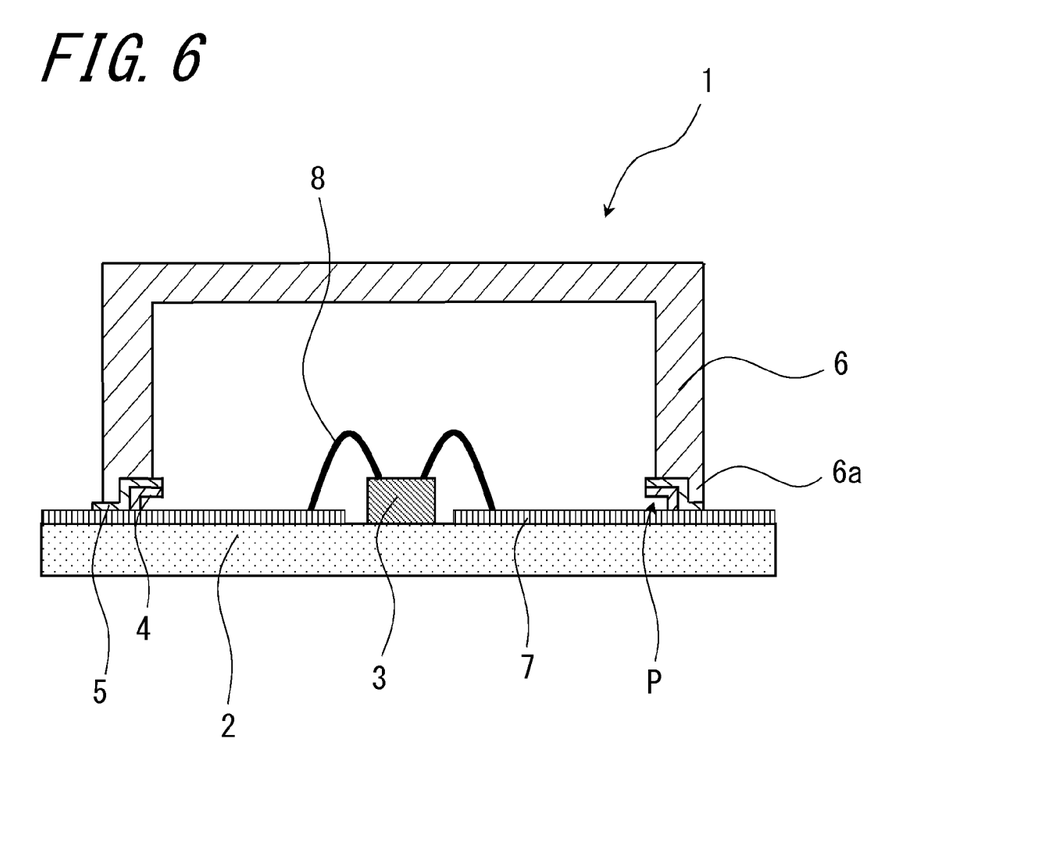
FIG. 6 is a cross-sectional view of a light emitting device according to a modified example.

Although, in the light emitting device 1 according to the above-described embodiment, the substrate 2 is made of an insulating ceramic material, the invention is not limited thereto. As shown in FIG. 6, the substrate 2 may be made of a metal material.

The substrate 2 is a substrate made of metal having high thermal conductivity and is made of a metal material such as, for example, copper or stainless steel, and, a wiring board 7 such as a printed circuit board where a through-hole is formed at a portion corresponding to a mounting portion of the light emitting element 3 is attached to the upper surface of the substrate 2 via an adhesive such as an epoxy resin or an acryl resin, a sealing material, or the like. In addition, the wavelength conversion member 6 is disposed on or above the wiring board 7.

In addition, in a case where the substrate 2 is a substrate made of metal, the light emitting element 3 is mounted on the substrate 2 via an adhesive such a silver epoxy adhesive which contains solder, a brazing material, or metal powder and has high thermal conductivity, and is electrically connected to a wiring pattern of the wiring board 7 where the through-hole is formed at the portion corresponding to the mounting portion of the light emitting element 3 adhered to the upper surface of the substrate 2 via bonding wires 8. In this way, it is possible to dissipate heat generated by the light emitting element 3 to the outside via the substrate 2 with high efficiency.

Figure 7:
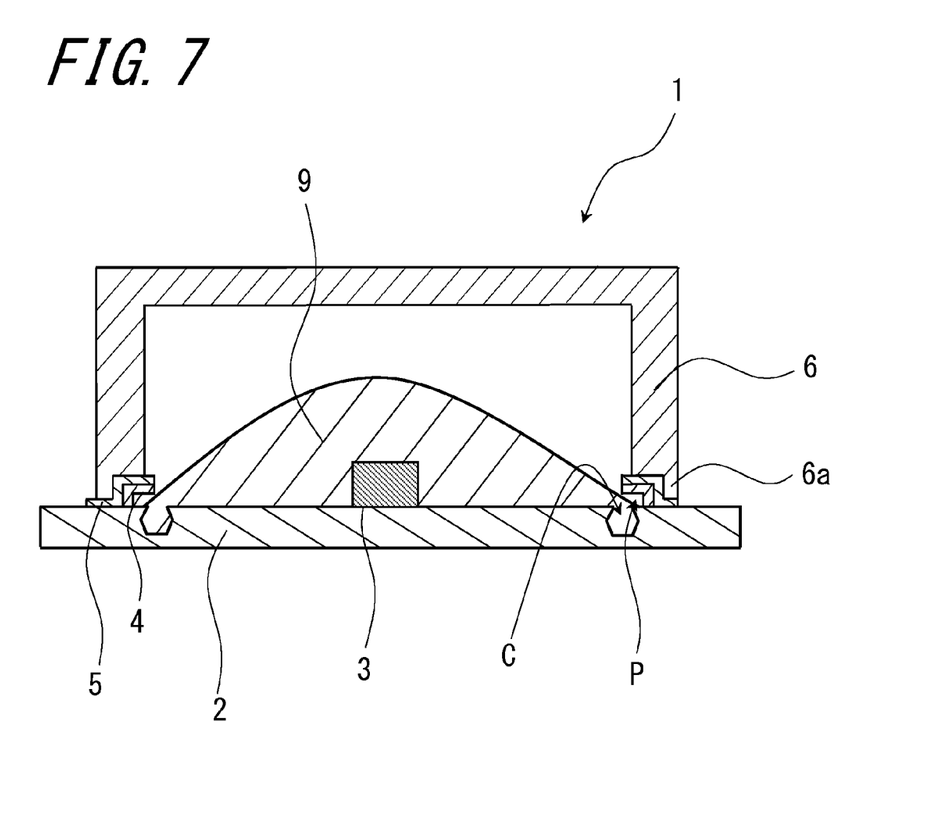
FIG. 7 is a cross-sectional view of a light emitting device according to a modified example.

Although the light emitting device 1 according to the above-described embodiment has a structure where the upper surface of the substrate 2 is flat, the invention is not limited thereto. As shown in FIG. 7, the substrate 2 may be provided with a groove C. The groove C is provided in a region surrounded by the light blocking member 4 in a plan view. In addition, the groove C is provided in a circular shape centering on the light emitting element 3 in a plan view. Further, the size of the groove C in the plane direction along the upper surface of the substrate 2 is set to, for example, 0.5 mm or more and 5 mm or less. The size of the groove C in the vertical direction to the upper surface of the substrate 2 is set to, for example, 0.3 mm or more and 3 mm or less. The groove C has a portion of which a transverse section in the plane direction along the upper surface of the substrate 2 is larger than the upper end of the groove C between the upper end of the groove C and the lower end of the groove C.

The groove C is provided in a region which overlaps a part of the substrate directly under the light blocking member 4 when viewed through from above. In addition, some of light reflected inward by the light blocking member 4 is reflected upward again inside the groove C so as to travel toward the wavelength conversion member 6, and thus it is possible to increase a light amount which undergoes wavelength conversion in the wavelength conversion member 6, thereby improving a light output of the light emitting device 1.

In addition, the light emitting element 3 is covered with a sealing member 9 which directly covers the light emitting element 3. A part of the sealing member 9 penetrates into the groove C and thus the sealing member 9 is firmly fixed thereto. The sealing member 9 is made of, for example, a light transmitting resin material such as a silicone resin, an acryl resin, or an epoxy resin, or a light transmitting glass material, and is formed by being potted with respect to the light emitting element 3 and being cured at a predetermined temperature.

Since the groove C is provided in the region surrounded by the light blocking member 4, the sealing member 9 is suppressed from leaking and spreading from the top of the light emitting element 3, crossing over the light blocking member 4, and undesirably leaking to the outside of the substrate 2. In addition, since a part of the sealing member 9 fills the groove C and thus the sealing member 9 is fixed thereto, separation of the light emitting element 3 from the substrate 2 can be made difficult due to an anchor effect of the sealing member 9.

<Manufacturing Method of Light Emitting Device>

Figure 1:
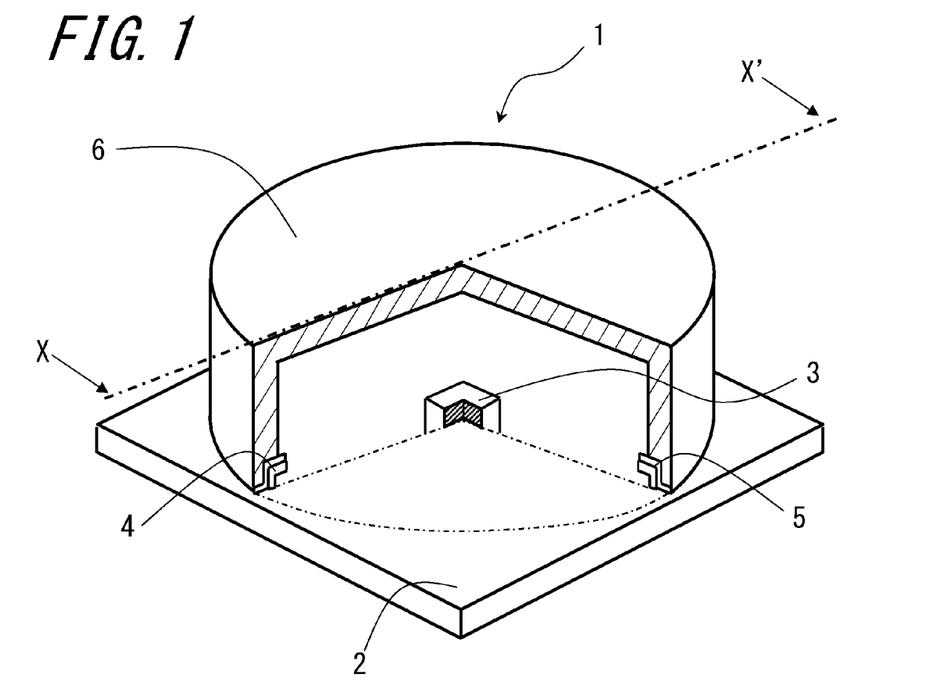
FIG. 1 is a cross-sectional perspective view illustrating an outline of a light emitting device according to an embodiment of the invention.

Here, a manufacturing method of the light emitting device shown in FIG. 1 will be described. First, the substrate 2 is prepared. In a case where the substrate 2 is made of, for example, an aluminum oxide sintered body, a mixture is obtained by adding and mixing an organic binder, a plasticizer, a solvent or the like to and with raw material powder such as aluminum oxide, silicon oxide, magnesium oxide, or calcium oxide. In addition, after the mixture fills a mold of the substrate 2 and is then dried, the substrate 2 before being sintered is taken out.

In addition, the light blocking member 4 is prepared. The light blocking member 4 may be manufactured using a molding technique such as, for example, casting, injection molding, or metallic molding.

In addition, metal powder with high melting point such as tungsten or molybdenum is prepared, and a metal paste is obtained by adding and mixing an organic binder, a plasticizer, a solvent or the like to and with the powder. Further, a wiring conductor is printed on a ceramic green sheet which is the taken-out substrate 2 in a predetermined pattern, and a plurality of ceramic green sheets are fired in a state of being stacked.

Next, a plating layer is formed on surfaces of the wiring conductor exposed to inside and outside of the substrate 2 in order to prevent oxidation of the wiring conductor. In addition, the light emitting element 3 is electrically connected via solder on the plating layer. Thereafter, the light blocking member 4 is formed surrounding the light emitting element 3 and is adhered onto the substrate 2 using an adhesive made of a silicone resin.

Next, the wavelength conversion member 6 is prepared. The wavelength conversion member 6 may be manufactured by mixing fluorescent substances with an uncured resin and by using a molding technique such as, for example, injection molding or metallic molding. In addition, the wavelength conversion member 6 can be obtained by filling a mold with the uncured wavelength conversion member 6, curing it and taking out the cured product.

Thereafter, a silicone resin is adhered on the edge of the lower end of the wavelength conversion member 6. In addition, the wavelength conversion member 6 is joined to the light blocking member 4 via the silicone resin, thereby the light emitting device 1 can be manufactured.

The invention claimed is:

1. A light emitting device, comprising:
    a substrate;
    a light emitting element disposed on the substrate;
    a wavelength conversion member disposed on or above the substrate, the wavelength conversion member covering the light emitting element spacing apart therefrom, and comprising a level difference on an outer peripheral side of a lower end of the wavelength conversion member, the lower end being joined to the substrate via a light transmitting member; and
    a light blocking member disposed on the substrate and disposed between the light emitting element and the light transmitting member,
    the wavelength conversion member being configured so that the lower end thereof extends from a top of the light transmitting member to a side of the light transmitting member.

2. The light emitting device according to claim 1, wherein the light blocking member is provided with a recess in an inside of the light blocking member facing a side of the light emitting element.

3. The light emitting device according to claim 2, wherein, the light blocking member is configured so that a size of the recess in a plane direction along an upper surface of the substrate is larger than a size of the recess in a vertical direction to the upper surface of the substrate.

4. The light emitting device according to claim 1, wherein the light blocking member is formed in a circular shape centering on the light emitting element in a plan view.

5. The light emitting device according to claim 1, wherein the light transmitting member is formed so as to continuously extend from a top of the light blocking member to a top of the substrate via an outside of the light blocking member.

6. The light emitting device according to claim 1, wherein the light emitting element is covered with a sealing member which directly covers the light emitting element, and
    wherein the substrate is provided with a groove in a part of the substrate directly under the light blocking member when viewed through from above, and a part of the sealing member penetrates into the groove.

7. The light emitting device according to claim 6, wherein the groove is formed surrounding the light emitting element.

* * * * *